United States Patent
Lee et al.

(10) Patent No.: US 6,946,729 B2
(45) Date of Patent: Sep. 20, 2005

(54) WAFER LEVEL PACKAGE STRUCTURE WITH A HEAT SLUG

(75) Inventors: Chun-Chi Lee, Kaoshiung (TW); Su Tao, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/417,693

(22) Filed: Apr. 17, 2003

(65) Prior Publication Data

US 2004/0018666 A1 Jan. 29, 2004

(30) Foreign Application Priority Data

Apr. 19, 2002 (TW) ......................................... 91108117 A (51) Int. Cl.⁷ ........................ H01L 23/34; H01L 23/02; H01L 23/48; H01L 23/495; H05K 7/20
(52) U.S. Cl. ...................... 257/707; 257/675; 257/676; 257/712; 257/713; 257/717; 257/720; 257/666; 257/684; 257/796; 257/698; 257/706; 361/704; 361/718
(58) Field of Search ................................. 257/796, 666, 257/676, 675, 684, 696, 698, 712, 717, 707–713, 720, 668, 706; 361/704, 718

(56) References Cited

U.S. PATENT DOCUMENTS

| | | | | |
|---|---|---|---|---|
| 5,598,321 A | * | 1/1997 | Mostafazadeh et al. | 361/704 |
| 5,616,957 A | * | 4/1997 | Kajihara | 257/712 |
| 5,705,851 A | * | 1/1998 | Mostafazadeh et al. | 257/675 |
| 5,777,391 A | * | 7/1998 | Nakamura et al. | 257/778 |
| 5,977,626 A | * | 11/1999 | Wang et al. | 257/707 |
| 6,087,104 A | * | 7/2000 | Yamada et al. | 435/6 |
| 6,184,580 B1 | * | 2/2001 | Lin | 257/712 |
| 6,198,171 B1 | * | 3/2001 | Huang et al. | 257/787 |
| 6,400,014 B1 | * | 6/2002 | Huang et al. | 257/712 |
| 6,429,513 B1 | * | 8/2002 | Shermer et al. | 257/714 |
| 6,462,405 B1 | * | 10/2002 | Lai et al. | 257/675 |
| 6,472,741 B1 | * | 10/2002 | Chen et al. | 257/712 |
| 6,534,859 B1 | * | 3/2003 | Shim et al. | 257/706 |
| 6,541,854 B2 | * | 4/2003 | Huang et al. | 257/707 |
| 6,559,525 B2 | * | 5/2003 | Huang | 257/675 |
| 6,590,281 B2 | * | 7/2003 | Wu et al. | 257/684 |
| 6,599,779 B2 | * | 7/2003 | Shim et al. | 438/122 |
| 6,703,698 B2 | * | 3/2004 | Huang et al. | 257/678 |
| 6,731,015 B2 | * | 5/2004 | Wu et al. | 257/796 |
| 2002/0079572 A1 | * | 6/2002 | Khan et al. | 257/707 |
| 2002/0109226 A1 | * | 8/2002 | Khan et al. | 257/737 |
| 2002/0190397 A1 | * | 12/2002 | Kim | 257/796 |
| 2003/0089983 A1 | * | 5/2003 | Huang et al. | 257/738 |
| 2003/0147215 A1 | * | 8/2003 | Weng | 361/700 |

FOREIGN PATENT DOCUMENTS

JP 2001-358259 * 12/2001

* cited by examiner

Primary Examiner—Alexander Oscar Williams
(74) Attorney, Agent, or Firm—Seyfarth Shaw LLP (57) ABSTRACT

A wafer level package structure and a method for packaging said wafer level package structure are described. The wafer level package structure at least comprises a die, a heat slug covering said die, a carrier for supporting said heat slug and said die, a plurality of wires electrically connecting said die and said carrier, and a mould compound encapsulating said die, said carrier, said heat slug and said wires. The method comprises the steps of: (a)providing a heat slug metal with a plurality of openings; (b)mounting said heat slug metal onto a wafer to dispose said openings on corresponding bonding pads of the wafer so as to expose said bonding pads; (c)sawing said combined heat slug metal and wafer into a plurality of die units; (d)attaching said die unit onto a carrier; (e)electrically connecting a plurality of wires to said die unit and said carrier; (f)encapsulating said wired die unit and said carrier. In the present invention, the heat slug metal and wafer can be sawed into a plurality of die units at the same time to improve the defect of the complicated process of individually sawing heat slug metal and wafer and individually combining heat slug metal and wafer in the conventional method.

9 Claims, 8 Drawing Sheets

WAFER LEVEL PACKAGE STRUCTURE WITH A HEAT SLUG

BACKGROUND OF THE INVENTION

1. Field of the Invention

The present invention relates to a package structure and packaging method, in particular, to a wafer level package structure and method for packaging the same.

2. Description of the Related Art

Figure 1:
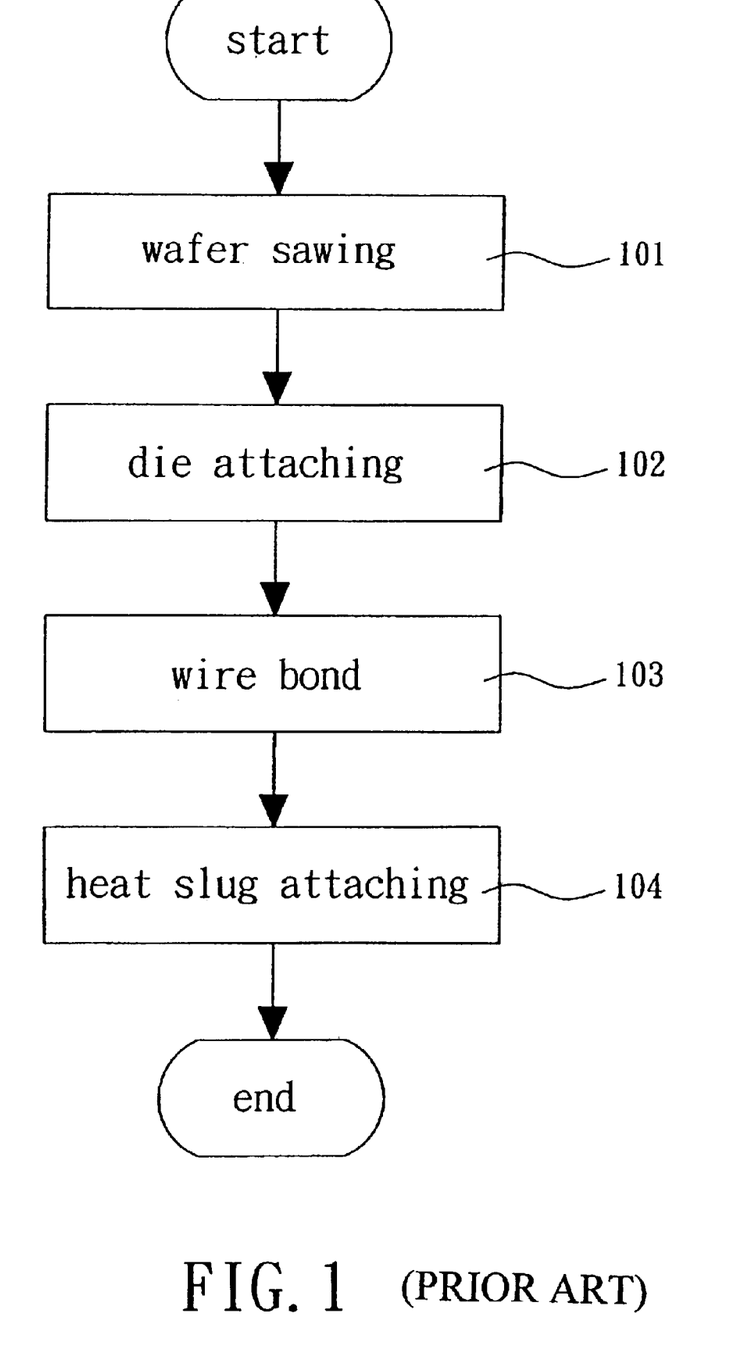
FIG. 1 is a flow chart illustrating a conventional package method.

Referring to FIG. 1, the first step in conventional packaging method is wafer sawing, as shown in step 101, which is to saw a wafer into a plurality of dice. Then the dice are attached onto a substrate or a lead frame, as shown in step 102. In step 103, a plurality of wires are used to connect the bonding pads of the dice with the substrate or the lead frame. Finally, a heat slug is mounted on the die for heat dissipation, as shown in step 104.

In the above conventional packaging method, the wafer and heat slug metal must be sawed individually into the dimension of the die and combined together to form a package. Since the dimension of a die and heat slug is very tiny, combining them is not easy. Thus, manufacturing process difficulty is increased and the cost is also increased.

Therefore, it is necessary to provide an innovative and advanced packaging method to solve the above problems.

SUMMARY OF THE INVENTION

The object of the present invention is to provide a method of packaging a wafer level package structure, said method comprising the steps of: (a) providing a heat slug metal, said heat slug metal having a plurality of openings; (b) mounting said heat slug metal onto a wafer to dispose said openings on corresponding bonding pads of the wafer so as to expose said bonding pads; (c) sawing said combined heat slug metal and wafer into a plurality of die units; (d) attaching said die unit onto a carrier; (e) electrically connecting a plurality of wires to said die unit and said carrier; (f) encapsulating said wired die unit and said carrier.

In the present invention, the heat slug metal and wafer are sawed at the same time, and the combined die unit is formed at once to improve the defect of the complicated process of individually sawing heat slug metal and wafer and individually combining heat slug metal and wafer in the conventional method. Therefore, the present invention can simplify the packaging process to reduce the manufacture cost.

The structures and characteristics of this invention can be realized by referring to the appended drawings and explanations of the preferred embodiments.

DETAILED DESCRIPTION OF THE INVENTION

Figure 2:
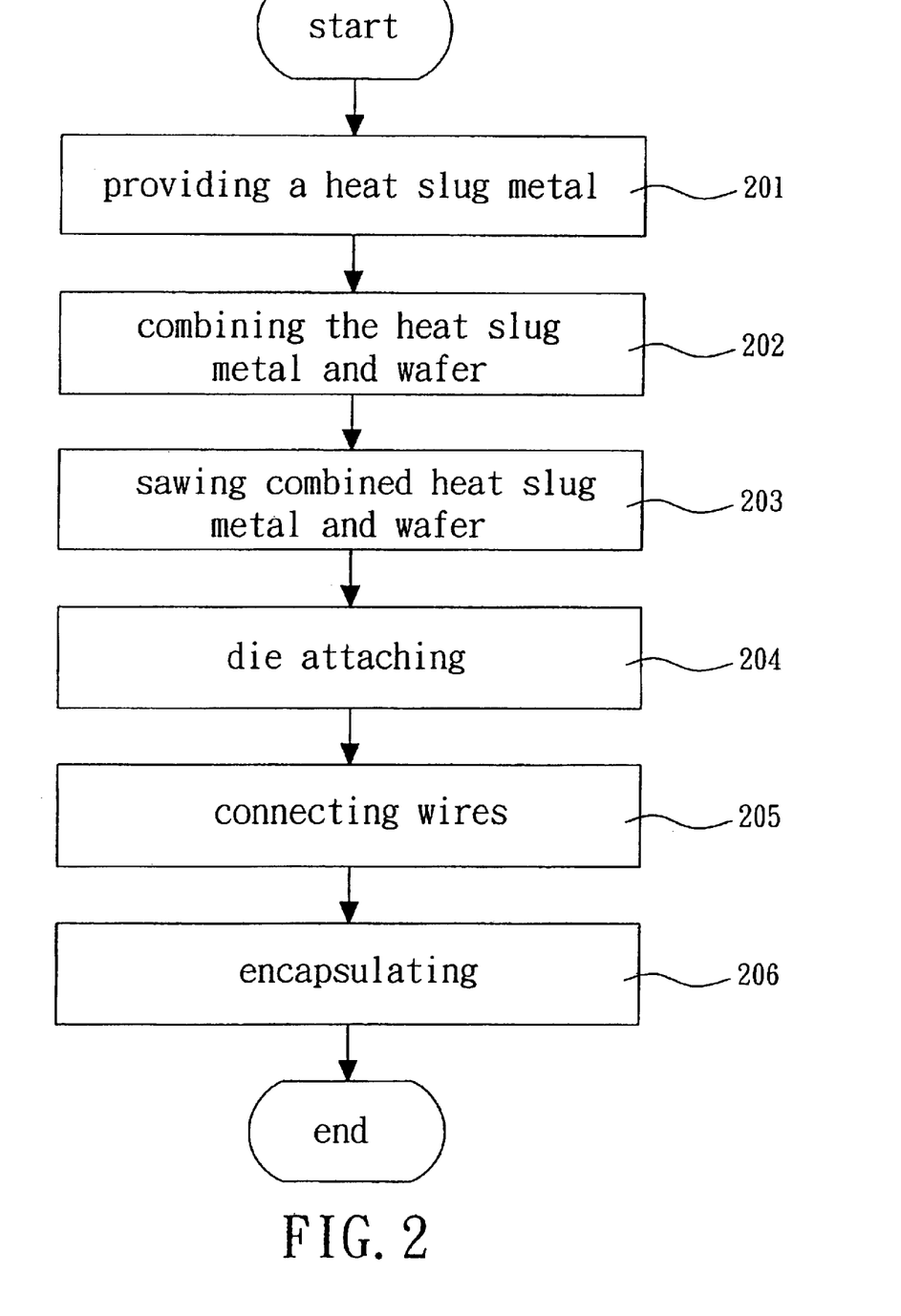
FIG. 2 is a flow chart illustrating a, method for packaging a wafer level package according to the preferred embodiment of the present invention.
Figure 3:
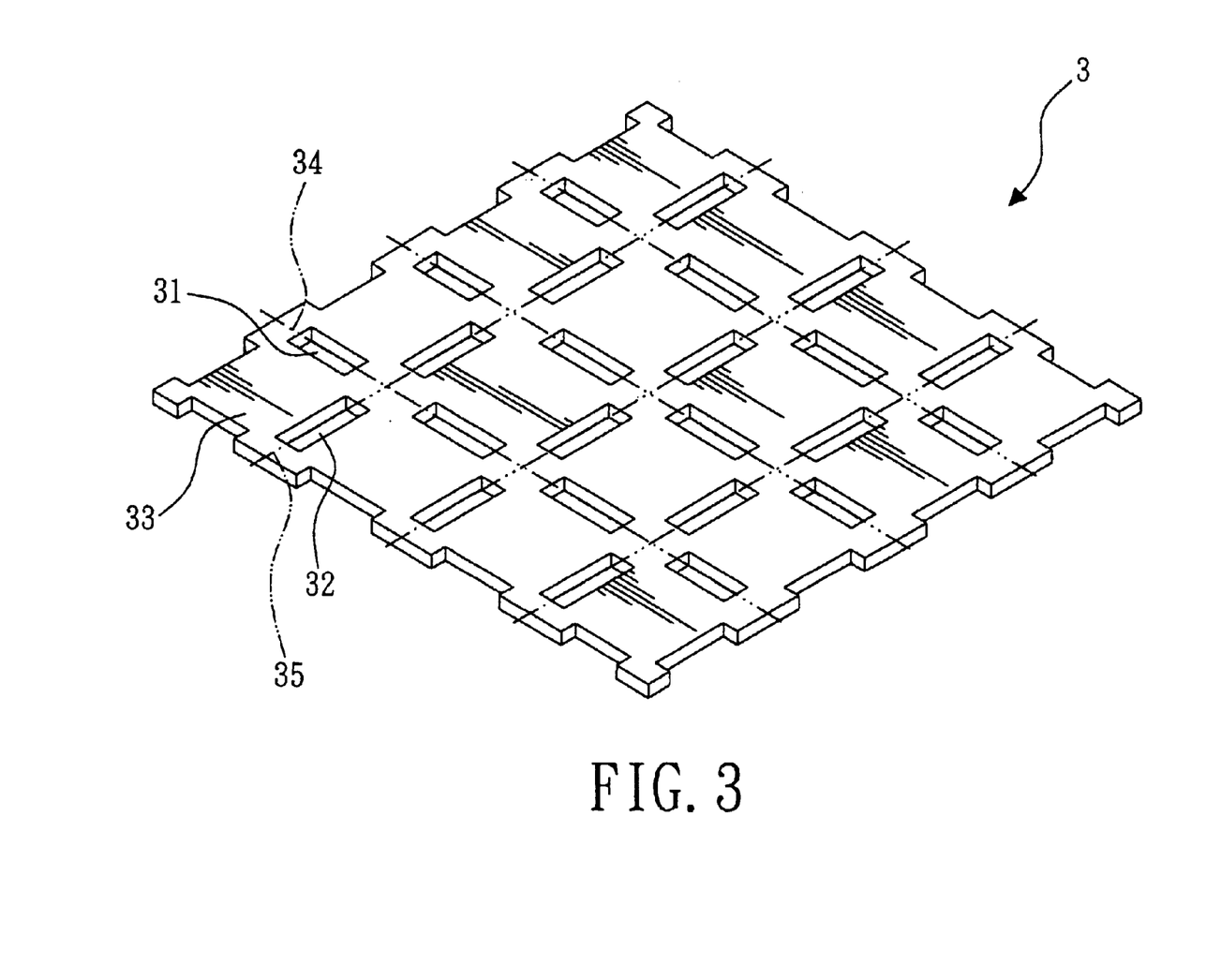
FIG. 3 shows a type of heat slug metal provided in the preferred embodiment of the present invention.

Referring to FIG. 2, a flow chart of the method for packaging a wafer level package according to the preferred embodiment of present invention is shown. First, in step 201, a heat slug metal 3 as shown in FIG. 3 is provided. The heat slug metal 3 has a plurality of openings 31, 32 thereof The heat slug metal 3 can be designed to be sawed into a plurality of heat slugs 33 (as illustrated in the sawing lines 34, 35, the size is approximately equal to the die.)

In step 202, the heat slug metal 3 is mounted onto a wafer. The wafer has not been sawed. After the heat slug metal 3 and the wafer are combined, the openings 31, 32 of the heat slug metal 3 are disposed on the position corresponding to the bonding pads of the wafer, and the bonding pads are exposed.

In step 203, the combined heat slug metal 3 and wafer is sawed into a plurality of die units 4 along the sawing lines 34, 35. In this step, the heat slug metal 3 and wafer are sawed at the same time, so as to improve the complicated process of individually sawing heat slug metal and wafer in the conventional method.

Figure 4:
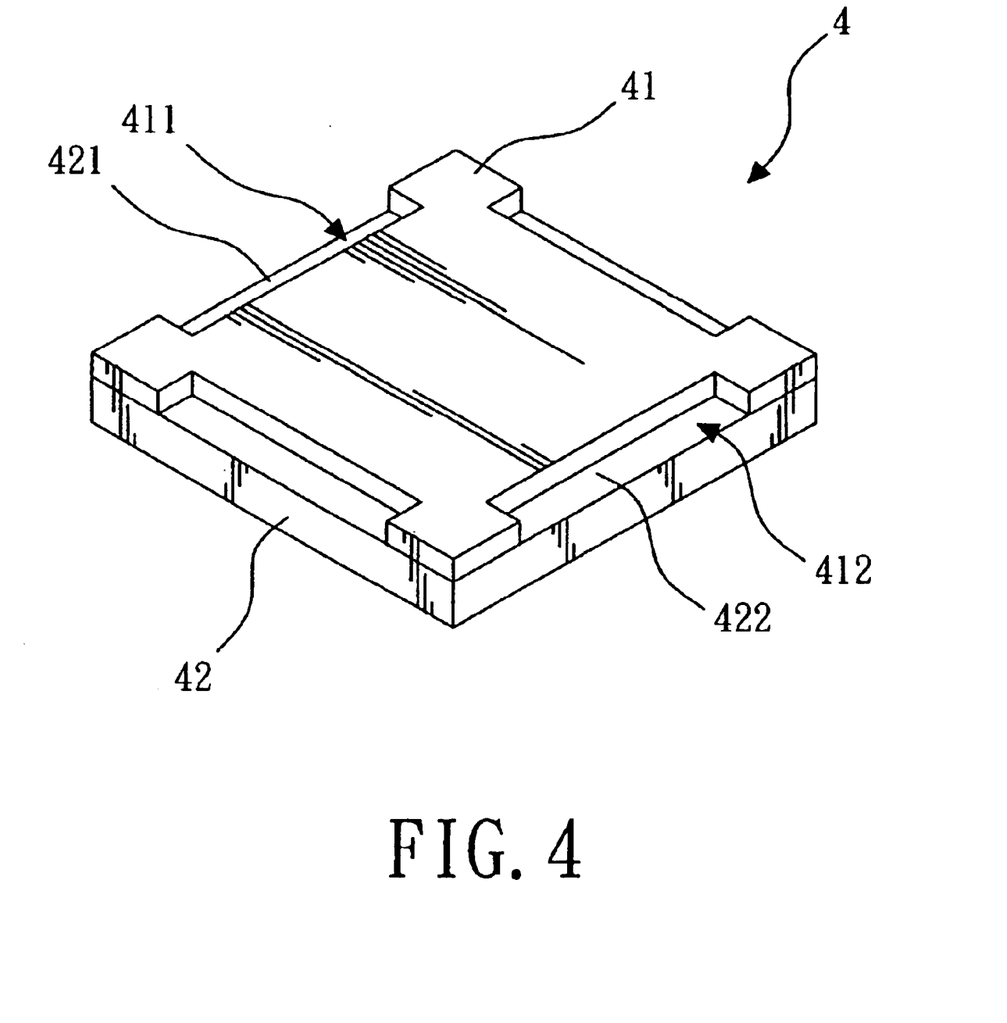
FIG. 4 shows a die unit covered with the heat slug that is formed by sawing the heat slug metal of FIG. 3.

Referring to FIG. 4, the die unit 4 has a heat slug 41 and a die 42. The heat slug 41 is mounted onto the die 42. Because the heat slug metal 3 has openings 31, 32, a plurality of recessed portions 411, 412 are formed on each side of the heat slug 41 to expose bonding pads 421, 422 of the die 42.

Figure 5:
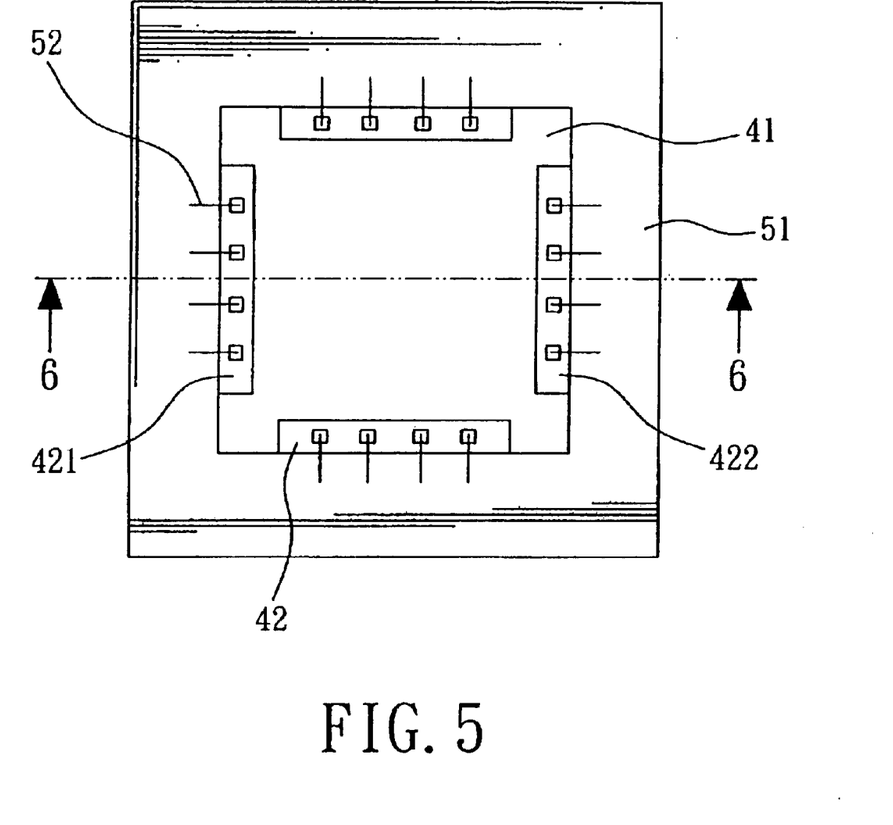
FIG. 5 is a top view of a package structure comprising the die unit of FIG. 4.

Step 204 illustrates the step for attaching die. Referring to FIG. 5, the die unit 4 (including the die 42 and the heat slug 41) is attached to the substrate 51. The die attaching process of the present invention is not limited to the adherence of the die unit 4 and the substrate 51, but can also be applied to the adherence of the die and the lead frame.

Step 205 illustrates the step for connecting wire. Because the heat slug metal 3 has openings 31, 32 to avoid covering the bonding pads 421, 422 of the die 42, the bonding pads 421, 422 of the die 42 can be exposed and connected to the substrate 51 by the wires 52 to form the electrical connection of the die 42 and the substrate 51. The wire connecting process of the present invention is not limited to the connection of the die 42 and the substrate 51, but can also be applied to the connection of the die and a carrier, e.g. lead frame.

Figure 6:
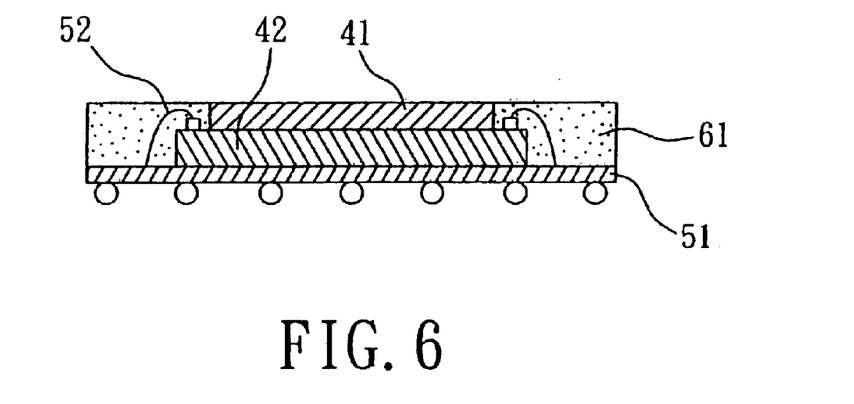
FIG. 6 is a cross-sectional view along line 6—6 of FIG. 5.

In step 206, the wired die unit 4 and substrate 51 are encapsulated by injecting mould compound 61 to form a package structure as shown in FIG. 6. After the package structure is formed, the heat slug 41 is exposed to the air to dissipate the heat efficiently. Also, the thickness of heat slug 41 must be designed to be larger than that of wires 52 to avoid the defect or failure caused by the wires 52 exceeding the heat slug 41 in height and the wires 52 exposing to the air from mould compound 61.

Figure 7:
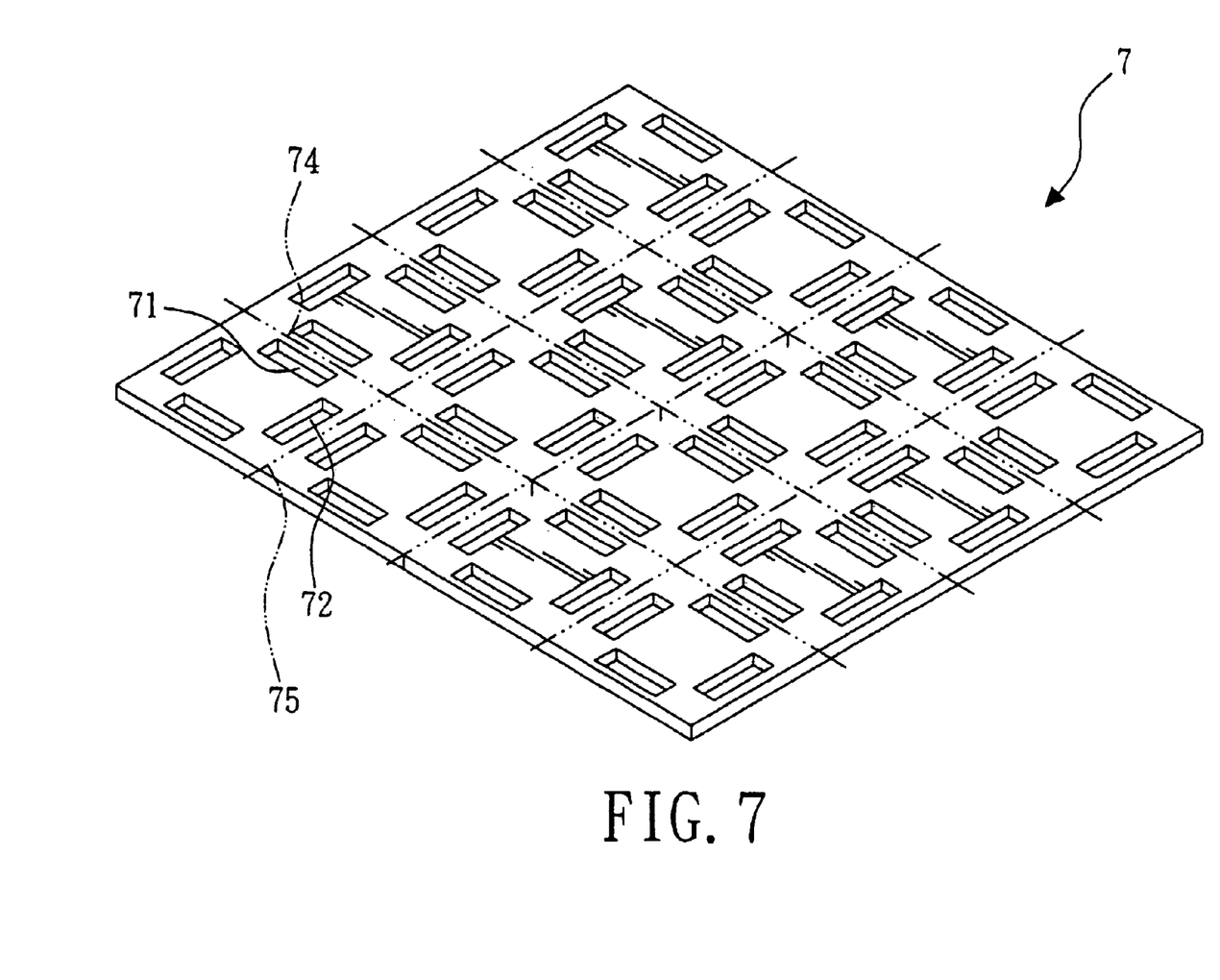
FIG. 7 shows another type of heat slug metal provided in the first embodiment of the present invention.
Figure 8:
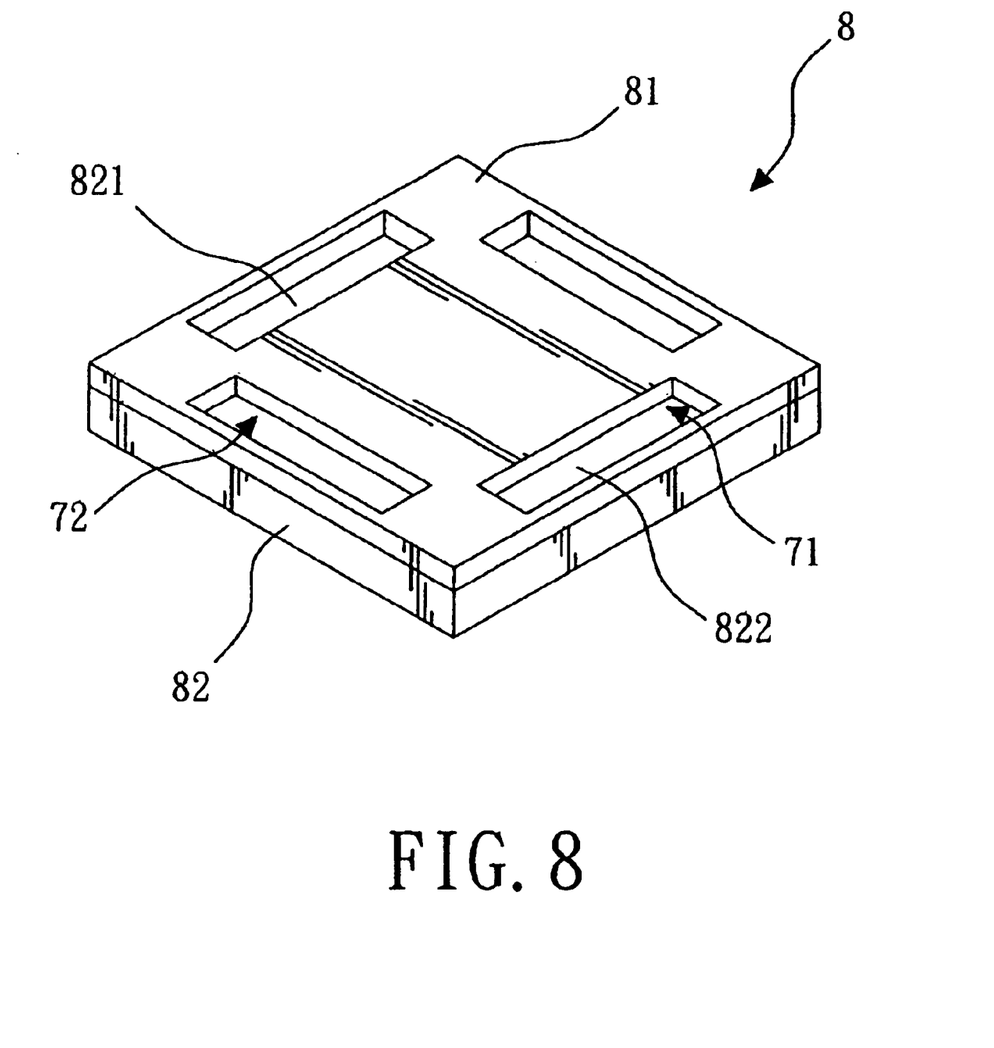
FIG. 8 shows a die unit covered with the heat slug that is formed by sawing the heat slug metal of FIG. 7.

Referring to FIG. 7, another type of heat slug metal 7 that is different from the heat slug 3 of FIG. 3 is shown. In this application, the heat slug metal 7 has a plurality of openings 71, 72 thereof After the heat slug metal 7 and the wafer are combined, the openings 71, 72 of the heat slug metal 7 are disposed on the position corresponding to the bonding pads of the wafer, and the bonding pads are exposed. Then the combined heat slug metal 7 and wafer is sawed into a plurality of die units 8 (as shown in FIG. 8) along the sawing lines 74, 75.

Figure 9:
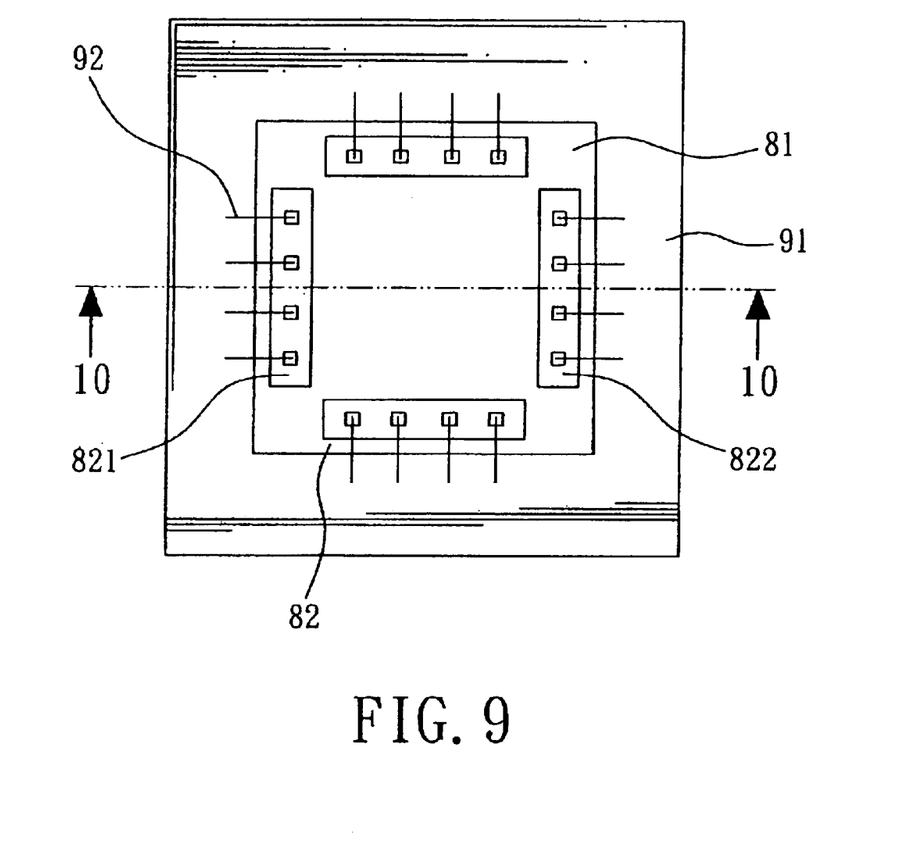
FIG. 9 is a top view of a package structure comprising the die unit of FIG. 8.
Figure 10:
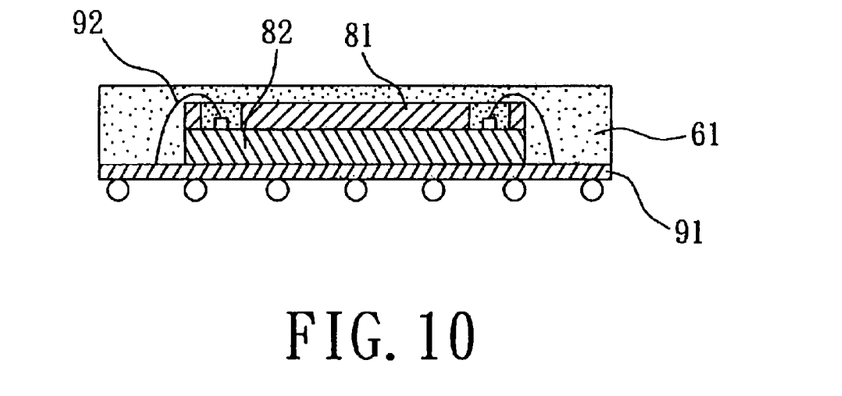
FIG. 10 is a cross-sectional view along line 10—10 of FIG. 9.

Referring to FIGS. 9 and 10, because the openings 71, 72 are not sawed, the bonding pads 821, 822 of the die 82 can be exposed. And a plurality of wires 92 are electrically connected bonding pads 821, 822 and substrate 91 through said openings 71, 72. Finally, the wired die unit 8 and substrate are encapsulated by injecting mould compound 61 to form a package structure.

While several embodiments of this invention have been illustrated and described, various modifications and improvements can be made by those skilled in the art. The embodiments of this invention are therefore described in an illustrative but not restrictive sense. It is intended that this invention may not be limited to the particular forms as illustrated, and that all modifications which maintain the spirit and scope of this invention are within the scope as defined in the appended claims.

What is claimed is:

1. A wafer level package structure, comprising:
   a die unit having a die and a heat slug, said die having a plurality of bonding pads formed on an upper surface thereof, said heat slug covering said upper surface of said die, and said heat slug having a plurality of recessed portions formed corresponding to said bonding pads to uncover and expose said bonding pads of said die;
   a carrier for supporting said die and said heat slug;
   a plurality of wires to electrically connect said bonding pads of said die and said carrier, wherein one end of each said wire is within a recessed portion; and
   a mould compound for encapsulating said die, said heat slug, said carrier and said wires.

2. The wafer level package structure claimed in claim 1, wherein said carrier is a substrate.

3. The wafer level package structure claimed in claim 1, wherein said is carrier is a lead frame.

4. The wafer level package structure claimed in claim 1, wherein said wires are electrically connected said bonding pads and said carrier through said gaps.

5. The wafer level package structure claimed in claim 1, wherein, said heat slug is exposed to the air.

6. A wafer level package structure, comprising:
   a die unit having a die and a heat slug, said die having a plurality of bonding pads formed on an upper surface thereof, said heat slug covering said upper surface of said die, and said heat slug having a plurality of openings formed therein corresponding to said bonding pads to uncover and expose said bonding pads of said die;
   a carrier for supporting said die and said heat slug;
   a plurality of wires to electrically connect said bonding pads of said die;
   a carrier for supporting said and said heat slug;
   a plurality of wires to electrically connect said bonding pads of said die and said carrier, wherein one end said wire is within at least one of the openings; and
   a mould compound for encapsulating said die, said heat slug, said carrier and said wires.

7. The wafer level package structure claimed in claim 6, wherein said carrier is a substrate.

8. The wafer level package structure claimed in claim 6, wherein said carrier is a lead frame.

9. The wafer level package structure claimed in claim 6, wherein said wires are electrically connected said bonding pads and said carrier through said openings.

* * * * *

UNITED STATES PATENT AND TRADEMARK OFFICE
CERTIFICATE OF CORRECTION

PATENT NO. : 6,946,729 B2
DATED : September 20, 2005
INVENTOR(S) : Chun-Chi Lee et al.

It is certified that error appears in the above-identified patent and that said Letters Patent is hereby corrected as shown below:

<u>Column 4,</u>
Line 11, before "electrically" insert -- adapted for -- and "connected" should be -- connecting --.
Line 12, "gaps" should be -- recessed portions --.
Line 25, after "said" insert -- die --.
Line 36, "connected" should be -- connecting --.

Signed and Sealed this

Thirteenth Day of December, 2005

JON W. DUDAS
*Director of the United States Patent and Trademark Office*